(12) United States Patent
Shimodaira et al.

(10) Patent No.: US 11,001,930 B2
(45) Date of Patent: May 11, 2021

(54) METHOD OF MANUFACTURING WIRING BOARD

(71) Applicant: SHINKO ELECTRIC INDUSTRIES CO., LTD., Nagano (JP)

(72) Inventors: Tomoyuki Shimodaira, Nagano (JP); Hitoshi Kondo, Nagano (JP)

(73) Assignee: SHINKO ELECTRIC INDUSTRIES CO, LTD., Nagano (JP)

( * ) Notice: Subject to any disclaimer, the term of this patent is extended or adjusted under 35 U.S.C. 154(b) by 0 days.

(21) Appl. No.: 16/905,096

(22) Filed: Jun. 18, 2020

(65) Prior Publication Data

US 2020/0413545 A1 Dec. 31, 2020

(30) Foreign Application Priority Data

Jun. 26, 2019 (JP) .............................. JP2019-118956

(51) Int. Cl.
| | |
|---|---|
| *C23F 1/00* | (2006.01) |
| *H05K 3/46* | (2006.01) |
| *H05K 3/00* | (2006.01) |
| *B81C 1/00* | (2006.01) |
| *H01L 21/3213* | (2006.01) |

(52) U.S. Cl.
CPC ............ *C23F 1/00* (2013.01); *B81C 1/00539* (2013.01); *H01L 21/32134* (2013.01); *H05K 3/002* (2013.01); *H05K 3/4644* (2013.01)

(58) Field of Classification Search
CPC .. H05K 3/002; H05K 3/4644; B81C 1/00539; H01L 21/32134; C23F 1/00
USPC ............................................. 216/13, 83, 100
See application file for complete search history.

(56) References Cited

U.S. PATENT DOCUMENTS

| | | | |
|---|---|---|---|
| 2002/0048685 A1* | 4/2002 | Bishop | H05K 3/383 428/687 |
| 2008/0261020 A1 | 10/2008 | Kawaguchi et al. | |
| 2011/0008644 A1* | 1/2011 | Naritomi | B29C 45/14311 428/612 |
| 2014/0131068 A1* | 5/2014 | Kim | H05K 3/46 174/251 |

FOREIGN PATENT DOCUMENTS

| | | | | |
|---|---|---|---|---|
| JP | 2003008199 A | * | 1/2003 | ............. C23C 22/63 |
| JP | 2008-109111 | | 5/2008 | |

* cited by examiner

*Primary Examiner* — Duy Vu N Deo
(74) *Attorney, Agent, or Firm* — IPUSA, PLLC

(57) ABSTRACT

A method of manufacturing a wiring board, includes forming an interconnect layer on a first insulating layer, roughening a surface of the interconnect layer, not in contact with the first insulating layer, to form concavo-convex portions, forming a bond enhancing film on the concavo-convex portions, partially removing the bond enhancing film, using an acid solution, and forming a second insulating layer on the first insulating layer, to cover the interconnect layer.

9 Claims, 8 Drawing Sheets

METHOD OF MANUFACTURING WIRING BOARD

CROSS-REFERENCE TO RELATED APPLICATION

This application is based upon and claims priority to Japanese Patent Application No. 2019-118956, filed on Jun. 26, 2019, the entire contents of which are incorporated herein by reference.

FIELD

Certain aspects of the embodiments discussed herein are related to a method of manufacturing a wiring board.

BACKGROUND

In a wiring board including an insulating layer that covers an interconnect layer, it is important from the viewpoint of improving the reliability of the wiring board, to improve the bonding strength (or adhesion) between the interconnect layer and the insulating layer. For this reason, various techniques are being studied to improve the bonding strength between the interconnect layer and the insulating layer.

For example, Japanese Laid-Open Patent Publication No. 2008-109111 describes a technique that obtains a chemical bonding strength by coating a liquid that includes a silane compound on a surface of the interconnect layer on which the insulating layer is laminated, thereafter drying for 5 minutes or less at a temperature of 25° C. to 100° C., and then washing and fixing the silane compound to form a coating (or film).

However, because a physical bond is used together with the chemical bond, the surface of the interconnect layer may be roughened. In this case, even when a technique similar to the above is used, it is difficult to form a uniform coating along irregularities (or concavo-convex portions) formed at the surface of the interconnect layer. In other words, a portion of the coating may not bond to the irregular (or concavo-convex) surface of the interconnect layer, and the coating may partially become excessively thick on the irregular surface of the interconnect layer. In such cases, a sufficiently strong bond cannot be obtained between the interconnect layer and the insulating layer.

SUMMARY

Accordingly, it is an object in one aspect of the embodiments to provide a method of manufacturing a wiring board, that can improve the bonding strength between an interconnect layer and an insulating layer.

According to one aspect of the embodiments, a method of manufacturing a wiring board, includes forming an interconnect layer on a first insulating layer; roughening a surface of the interconnect layer, not in contact with the first insulating layer, to form concavo-convex portions; forming a bond enhancing film on the concavo-convex portions; partially removing the bond enhancing film, using an acid solution; and forming a second insulating layer on the first insulating layer, to cover the interconnect layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
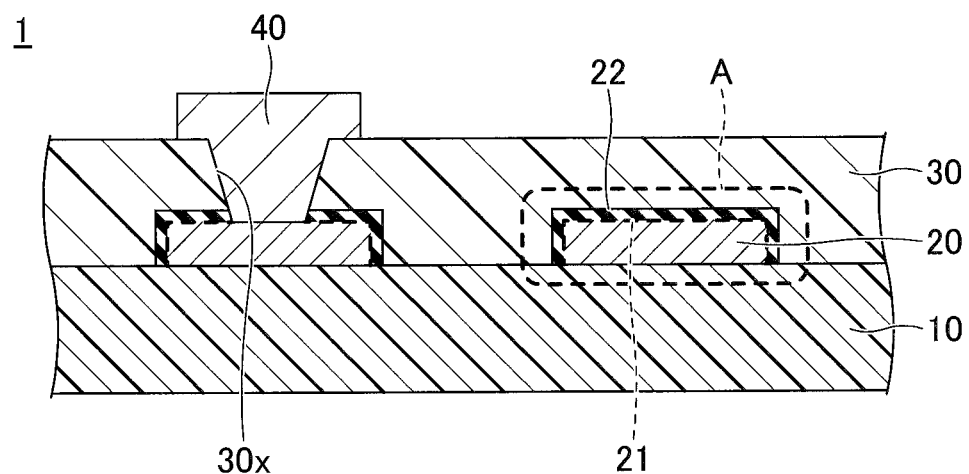
FIG. 1A and FIG. 1B are cross sectional views illustrating an example of a wiring board according to a first embodiment.

Preferred embodiments of the present invention will be described with reference to the accompanying drawings. In the drawings, those parts that are the same are designated by the same reference numerals, and a repeated description of the same parts may be omitted.

[Structure of Wiring Board]

Figure 1B:
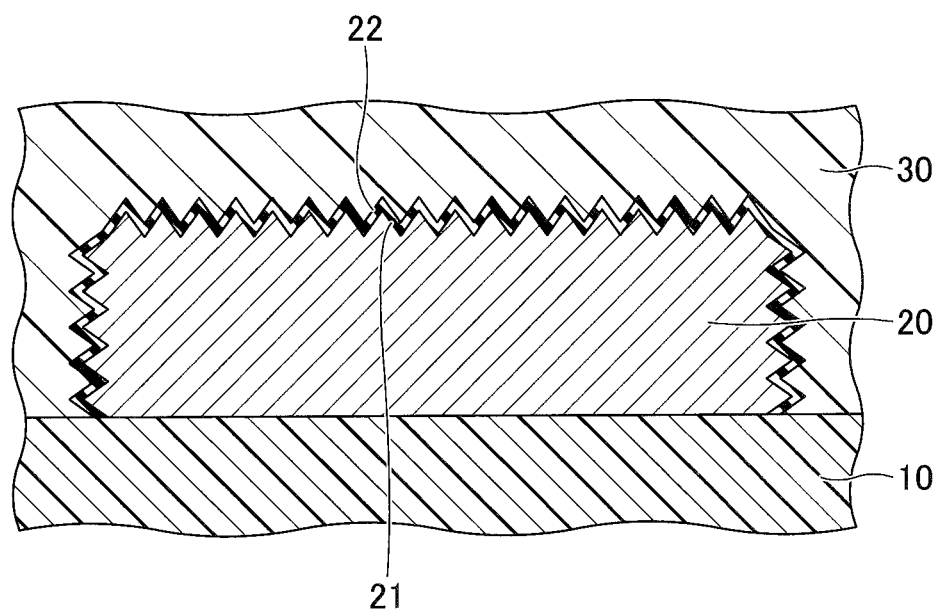

FIG. 1A and FIG. 1B are cross sectional views illustrating an example of a wiring board according to a first embodiment. FIG. 1A illustrates a part of the wiring board having a plurality of insulating layers and a plurality of interconnect layers, in which the insulating layer and the interconnect layer are alternately laminated. FIG. 1B is an enlarged view of a portion A indicated by dotted lines in FIG. 1A.

As illustrated in FIG. 1A and FIG. 1B, a wiring board 1 includes an insulating layer 10, an interconnect layer 20, an insulating layer 30, and an interconnect layer 40.

In this embodiment, it is assumed for the sake of convenience that the side of the insulating layer 30 forms "an upper side" or "one side" of the wiring board 1, and that the side of the insulating layer 10 forms "a lower side" or "the other side" of the wiring board 1. It is also assumed that a surface of a portion on the side of the insulating layer 30 forms "an upper surface" or "one surface" of the portion, and that a surface of the portion on the side of the insulating layer 10 forms "a lower surface" or "the other surface" of the portion. However, the wiring board 1 may be used in an up-side-down state, or may be arranged at an arbitrary angle. In addition, "a plan view" refers to a view of a target object from above the wiring board 1 in a normal direction with respect to the upper surface of the insulating layer 10. Further, "a planar shape" of the target object refers to the shape of the target object in the plan view viewed from above the wiring board 1 in the normal direction with respect to the upper surface of the insulating layer.

The insulating layer 10 is formed by the build-up method, as an interlayer insulator of a multilayer interconnection, for example. Accordingly, other interconnect layers and other insulating layers may be laminated as underlayers, under the insulating layer 10. In this case, via holes may be provided in the insulating layer 10 and the other insulating layers, as appropriate, to connect the interconnection layers through the via holes.

The materials usable for the insulating layer 10 include epoxy insulating resins, polyamide insulating resins, or the like that are nonphotosensitive (thermosetting resins), for example. Alternatively, the materials usable for the insulating layer 10 include epoxy insulating resins, acrylic insulating resins, or the like that are photosensitive, for example. The insulating layer 10 may include a reinforcing material such as glass cloth (or fabric) or the like. In addition, the insulating layer 10 may include a filler such as silica ($SiO_2$) or the like. The thickness of the insulating layer 10 may be approximately 10 μm to approximately 50 μm, for example.

The interconnect layer 20 is formed on the insulating layer 10. The materials usable for the interconnect layer 20 include copper (Cu) or the like, for example. The thickness of the interconnect layer 20 may be approximately 10 μm to approximately 20 μm, for example.

A roughening process is performed on the upper surface and side surfaces of the interconnect layer 20, to form concavo-convex portions 21. The concavo-convex portions 21 have a roughness Ra to such an extent that does not deteriorate electrical characteristics due to the skin effect, and the roughness Ra is in range of approximately 50 nm to approximately 200 nm, for example.

A bond enhancing film (a bond strengthening film or coating) 22 having a shape in accordance with the concavo-convex portions 21 is formed on the upper and side surfaces of the interconnect layer 20 formed with the concavo-convex portions 21. In other words, a surface of the bond enhancing film 22 has a concavo-convex shape with a roughness that is approximately the same as that of the concavo-convex portions 21. The materials usable for the bond enhancing film 22 include a silane coupling agent or the like, for example. The thickness of the bond enhancing film 22 may be approximately 3 nm to approximately 8 nm, for example. In FIG. 1A, the concavo-convex portions 21 are illustrated by dotted lines.

In the silane coupling agent, a functional group that chemically bonds to an organic material such as a resin or the like, preferably includes an amino group, an epoxy group, a mercapto group, an isocyanate group, a methacryloxy group, an acryloxy group, an ureide group, a sulfide group, or the like. An optimum functional group may be selected according to the kind of resin that chemically bonds to the silane coupling agent.

Further, in the silane coupling agent, the functional group that chemically bonds to the organic material such as a metal or the like, preferably includes an azole group, a silanol group, a methoxy group, an ethoxy group, or the like. An optimum functional group may be selected according to the kind of metal that chemically bonds to the silane coupling agent.

A titanium coupling agent may be used in place of the silane coupling agent.

The insulating layer 30 is formed on the insulating layer 10, so as to cover the interconnect layer 20. The material and the thickness of the insulating layer 30 may be similar to those of the insulating layer 10, for example. The insulating layer 30 may include a filler such as silica ($SiO_2$) or the like.

The interconnect layer 40 is formed on the upper side of the insulating layer 30. The interconnect layer 40 includes a via interconnect filling the inside of a via hole (or opening) 30x that penetrates the insulating layer 30 and exposes the upper surface of the interconnect layer 20, and an interconnect pattern that is formed on the upper surface of the insulating layer 30. The interconnect pattern of the interconnect layer 40 is electrically connected to the interconnect layer 20 through the via interconnect. The via hole 30x is a recess having an inverted truncated cone shape with an opening that opens to the upper surface side of the insulating layer 30. For example, the diameter of this opening of the recess is greater than a diameter of a bottom surface of the recess, formed by the upper surface of the interconnect layer 20. The material and the thickness of the interconnect pattern of the interconnect layer 40 may be similar to those of the interconnect layer 20, for example.

Accordingly, in the wiring board 1, the concavo-convex portions 21 are formed on the upper and side surfaces of the interconnect layer 20. In addition, the bond enhancing film 22, having the shape in accordance with the concavo-convex portions 21, is formed. The surface of the bond enhancing film 22 has a concavo-convex shape having a roughness that is approximately the same as that of the concavo-convex portions 21.

Due to the anchor effect of the concavo-convex portions formed on the surface of the bond enhancing film 22, it is possible to increase a physical bonding strength between the interconnect layer 20 and the insulating layer 30. Further, because the bond enhancing film 22 makes contact with the insulating layer 30, it is possible to increase a chemical bonding strength between the interconnect layer 20 and the insulating layer 30.

Moreover, in the wiring board 1, the fine concavo-convex portions 21 formed on the upper and side surfaces of the interconnect layer 20 have the roughness that is not increase more than necessary. For this reason, it is possible to reduce the deterioration of the electrical characteristics due to the skin effect.

[Method of Manufacturing Wiring Board]

Next, a method of manufacturing the wiring board according to the first embodiment will be described. FIG. 2A through FIG. 4C are diagrams for explaining examples of manufacturing processes (or steps) of the wiring board according to the first embodiment. Although the processes for forming a single wiring board is illustrated in this embodiment, it is of course possible to simultaneously manufacture a plurality of parts respectively corresponding to the wiring boards on a substrate, and perform a process to segment the substrate into individual pieces respectively corresponding to the wiring boards.

Figure 2A:
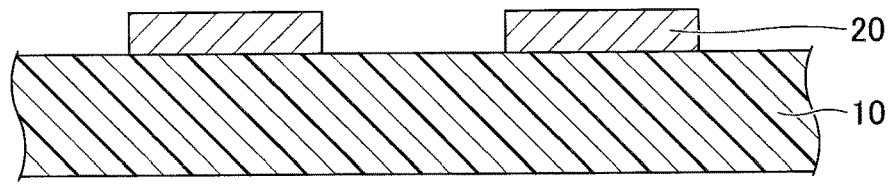
FIG. 2A, FIG. 2B, FIG. 2C, and FIG. 2D are diagrams for explaining examples of manufacturing processes of the wiring board according to the first embodiment.

First, in the process illustrated in FIG. 2A, the insulating layer 10 is prepared, and the interconnect layer 20 is formed on the insulating layer 10 by a known sputtering method, plating method, or the like.

Figure 2B:
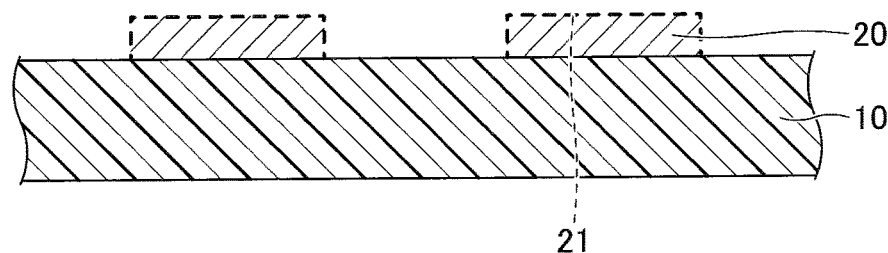

Next, in the process illustrated in FIG. 2B, the surfaces (upper and side surfaces) of the interconnect layer 20, not in contact with the insulating layer 10, are roughened to form the concavo-convex portions 21. The roughness Ra of the concavo-convex portions 21 is approximately 50 nm to approximately 200 nm, for example. A roughening process on the upper and side surfaces of the interconnect layer 20 may be performed by a wet etching using a formic acid, for example.

Figure 2C:
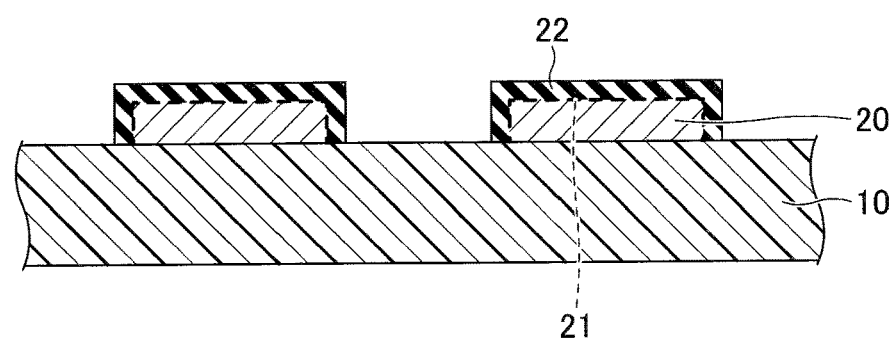

Next, in the process illustrated in FIG. 2C, the bond enhancing film 22 is formed on the concavo-convex portions 21 of the interconnect layer 20. The bond enhancing film 22 is formed to the shape in accordance with the concavo-convex portions 21, on the upper and side surfaces of the interconnect layer 20 formed with the concavo-convex portions 21. The surface of the bond enhancing film 22 has the roughness that is approximately the same as that of the concavo-convex portions 21. The bond enhancing film 22 is formed using the silane coupling agent, for example. The thickness of the bond enhancing film 22, at a thickest portion thereof, is approximately 20 nm to approximately 30 nm, for example.

When forming the bond enhancing film 22 using the silane coupling agent, the structure illustrated in FIG. 2B may be dipped into a dilution of the silane coupling agent, for example. Alternatively, the dilution of the silane coupling agent may be sprayed and coated on the upper and side surfaces of the interconnect layer 20 of the structure illustrated in FIG. 2B, to form the bond enhancing film 22. A concentration of the dilution of the silane coupling agent may be 0.1% to 10%, and preferably 0.5% to 5%, for example.

Figure 2D:
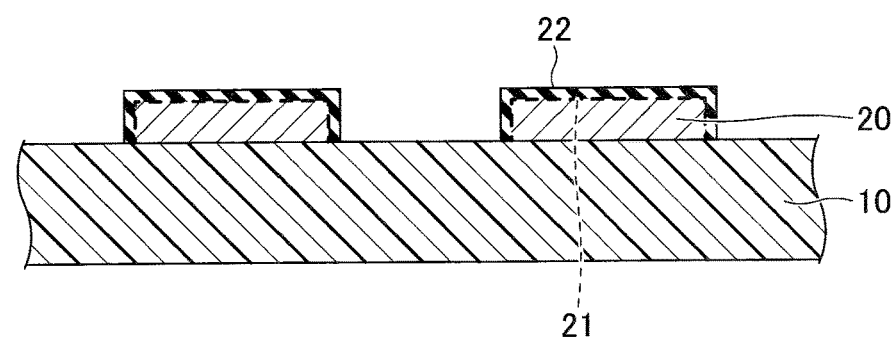

Next, in the process illustrated in FIG. 2D, the structure illustrated in FIG. 2C is washed, and the bond enhancing film 22 is thereafter partially removed using a remover liquid (or acid solution), to increase the uniformity of the thickness of the bond enhancing film 22, before drying. The thickness of the bond enhancing film 22 becomes approximately 3 nm to approximately 8 nm, for example.

Next, a mechanism for increasing (or improving) the uniformity of the thickness of the bond enhancing film 22 will be described in detail. FIG. 3A through FIG. 3D are partial enlarged views of FIG. 2C and FIG. 2D.

Figure 3A:
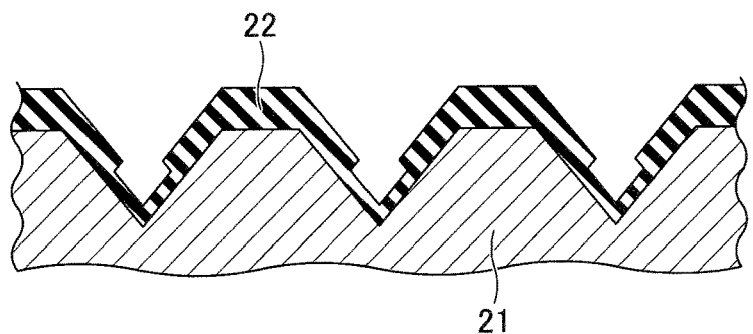
FIG. 3A, FIG. 3B, FIG. 3C, and FIG. 3D are diagrams for explaining examples of the manufacturing processes of the wiring board according to the first embodiment.

FIG. 3A schematically illustrates the bond enhancing film 22, that is formed on the upper surface of the interconnect layer 20 formed with the concavo-convex portions 21 in the process illustrated in FIG. 2C, on an enlarged scale.

When forming the bond enhancing film 22 using a chemical (the dilution of the silane coupling agent or the like), if the chemical is viscous, the chemical may not reach the bottom of the concave of the concavo-convex portions 21, and uncoated portions not formed with the bond enhancing film 22 may occur on the upper surface of the interconnect layer 20.

Hence, in this embodiment, in order to prevent uncoated portions not formed with the bond enhancing film 22 from occurring at the bottom of the concave of the concavo-convex portions 21, a sufficiently long processing time is provided to allow the chemical to reach the bottom of the concave of the concavo-convex portions 21.

As a result, as illustrated in FIG. 3A, the bond enhancing film 22 is formed along the concavo-convex portions 21, including the bottom of the concave of the concavo-convex portions 21. More particularly, a relatively thin bond enhancing film 22 is formed on the bottom of the concave of the concavo-convex portions 21, and a relatively thick bond enhancing film 22 is formed on other portions of the concavo-convex portions 21, including a portion on an opposite side from the bottom of the concave of the concavo-convex portions 21. Hence, uncoated portions, not formed with the bond enhancing film 22, are prevented from occurring on the concavo-convex portions 21.

In other words, the bond enhancing film 22 that is formed has a structure including a thin portion formed at the bottom of the concave of the concavo-convex portions 21, and a thick portion formed on the opposite side from the bottom of the concave of the concavo-convex portions 21. The thin portion formed at the bottom of the concave of the concavo-convex portions 21 has a thickness of approximately 3 nm to approximately 8 nm, for example. The thick portion formed on the opposite side from the bottom of the concave of the concavo-convex portions 21 has a thickness of approximately 20 nm to approximately 30 nm, for example. A recommended viscosity of the chemical forming the bond enhancing film 22 is approximately 5 cP to approximately 10 cP.

Figure 3B:
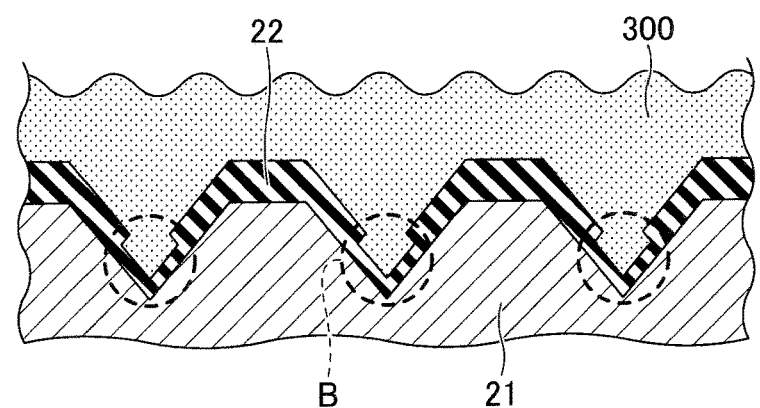
Figure 3C:
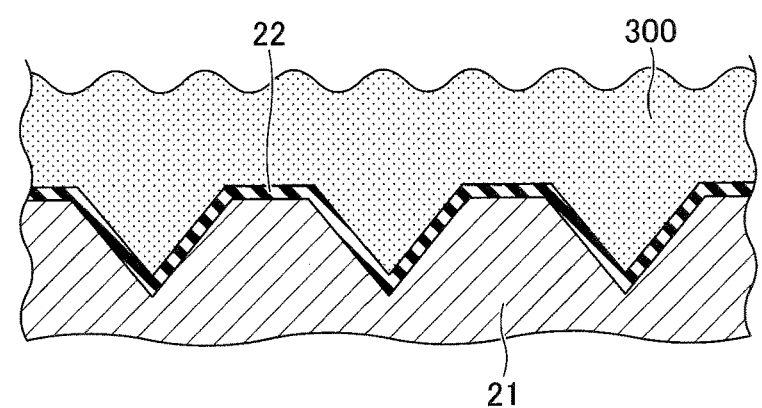
Figure 3D:
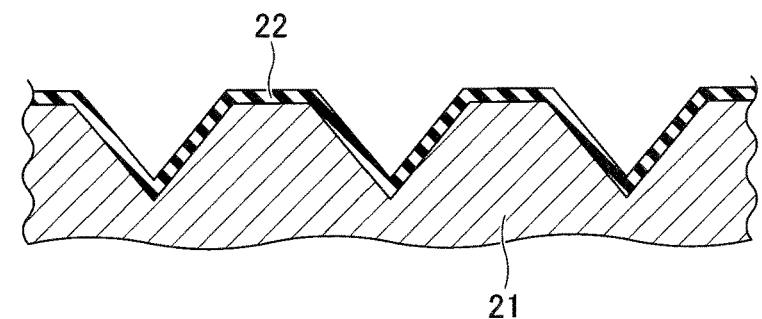

FIG. 3B through FIG. 3D schematically illustrate, on an enlarged scale, states where the uniformity of the thickness of the bond enhancing film 22 is increased in the process illustrated in FIG. 2D.

FIG. 3B illustrates the state immediately after dipping the bond enhancing film 22 in a remover liquid 300. An acid solution having a potential of hydrogen (pH) of 0 to 5 may be used for the remover liquid 300. The acid used for the remover liquid 300 is preferably a sulfuric acid. In this embodiment, the remover liquid 300 is adjusted to a viscosity that enables the remover liquid 300 to reach the bottom of the concave of the concavo-convex portions 21. More particularly, the viscosity of the remover liquid 300 is approximately the same as or lower than the viscosity of the solution forming the bond enhancing film 22. A recommended viscosity of the remover liquid 300 is approximately 1 cP to approximately 10 cP. Accordingly, the remover liquid 300 can reach the bottom of the concave of the concavo-convex portions 21, that is, a portion B indicated by dotted lines in FIG. 3B.

FIG. 3C schematically illustrates, on the enlarged scale, the state after the bond enhancing film 22 is dipped into the remover liquid 300 and a predetermined time elapses.

The remover liquid 300 that once reaches the bottom of the concave of the concavo-convex portions 21, that is, the portion B illustrated in FIG. 3B, is in a trapped state at a stagnant site where replacement (or refreshment) of the trapped remover liquid 300 by a new remover liquid 300 is difficult, thereby delaying the processing speed. On the other hand, the portion on the opposite side from the bottom of the concave of the concavo-convex portions 21 is constantly in contact with the new remover liquid 300, thereby enabling a high processing speed to be maintained.

In other words, the processing speed at the portion on the opposite side from the bottom of the concave of the concavo-convex portions 21 becomes faster than the processing speed at the bottom of the concave of the concavo-convex portions 21, and the bond enhancing film 22 formed at the portion on the opposite side from the bottom of the concave of the concavo-convex portions 21 is removed quicker than the bond enhancing film 22 formed at the bottom of the concave of the concavo-convex portions 21. Consequently, after the predetermined elapses, the bond enhancing film 22 formed at the portion other than the bottom of the concave of the concavo-convex portions 21 is partially removed, as illustrated in FIG. 3C, to increase the uniformity of the thickness of the bond enhancing film 22. Preferably, the bond enhancing film 22 has an approximately uniform thickness totally on the concavo-convex portions 21.

Accordingly, the process that improves the uniformity of the thickness of the bond enhancing film 22 is a process that reduces a difference between the thickness of the thin portion formed on the bottom of the concave of the concavo-convex portions 21, and the thickness of the thick portion formed on the opposite side from the bottom of the concave of the concavo-convex portions 21.

The processing time required until the bond enhancing film 22 has the approximately uniform thickness totally on the concavo-convex portions 21 may be known from experimentation or simulation, by taking into consideration the inconsistency in the thickness of the bond enhancing film 22, the viscosity of the remover liquid 300, or the like.

FIG. 3D schematically illustrates, on the enlarged scale, the state after drying the bond enhancing film 22. After the process illustrated in FIG. 3C, the remover liquid 300 is removed, and the bond enhancing film 22 is dried, to obtain the bond enhancing film 22 illustrated in FIG. 3D.

Figure 4A:
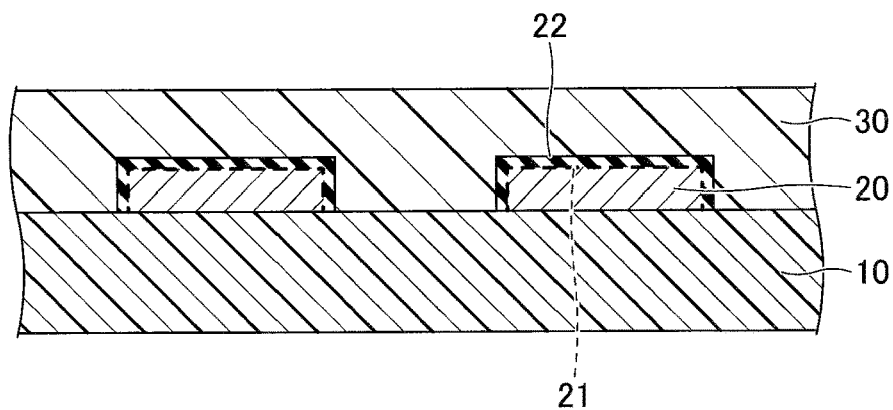
FIG. 4A, FIG. 4B, and FIG. 4C are diagrams for explaining examples of the manufacturing processes of the wiring board according to the first embodiment.

Returning now to the description of the manufacturing process, after the process illustrated in FIG. 2D, the process illustrated in FIG. 4A is performed to form the insulating layer 30, that covers the interconnect layer 20, on the insulating layer 10. More particularly, a film in a semi-cured state and made of a nonphotosensitive thermosetting resin that includes an epoxy resin, a polyimide resin, or the like as a main component thereof, is laminated on the insulating layer 10 so as to cover the interconnect layer 20, and thereafter cured to form the insulating layer 30. Alternatively, instead of laminating the film made of the epoxy resin or the like, the epoxy resin or the like in a liquid state or a paste state may be coated, and thereafter cured to form the insulating layer 30.

Figure 4B:
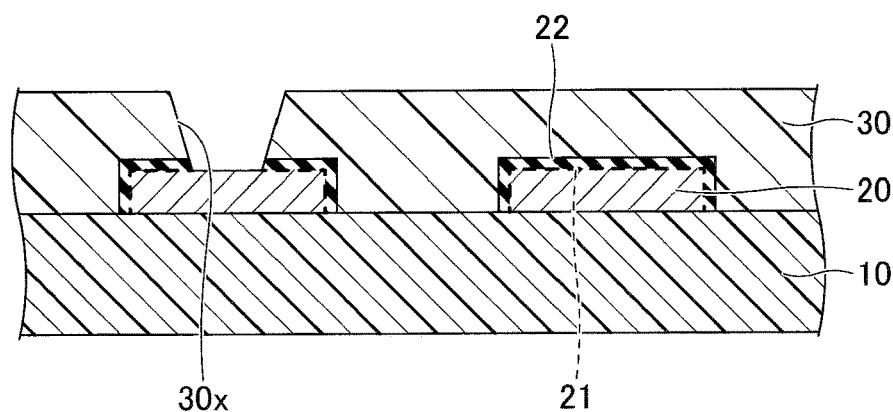

Next, in the process illustrated in FIG. 4B, the via hole 30x, that penetrates the insulating layer 30 and exposes the upper surface of the interconnect layer 20, is formed in the insulating layer 30. The via hole 30x may be formed by a laser processing using $CO_2$ laser or the like, for example. The via hole 30x is the recess having the inverted truncated cone shape with the opening that opens to the upper surface side of the insulating layer 30. For example, the diameter of this opening of the recess is greater than the diameter of the bottom surface of the recess, formed by the upper surface of the interconnect layer 20.

After forming the via hole 30x, a desmearing process is preferably performed to remove a resin residue adhered to the surface of the interconnect layer 20 exposed at the bottom of the via hole 30x. The bond enhancing film 22 adhered to the surface of the interconnect layer 20 exposed at the bottom of the via hole 30x is removed by the desmearing process. After the desmearing process, a soft etching may be performed on the surface of the interconnect layer 20 exposed at the bottom of the via hole 30x. By performing the soft etching, the concavo-convex portions 21 on the surface of the interconnect layer 20 exposed at the bottom of the via hole 30x are removed, thereby smoothening the surface of the interconnect layer 20.

Figure 4C:
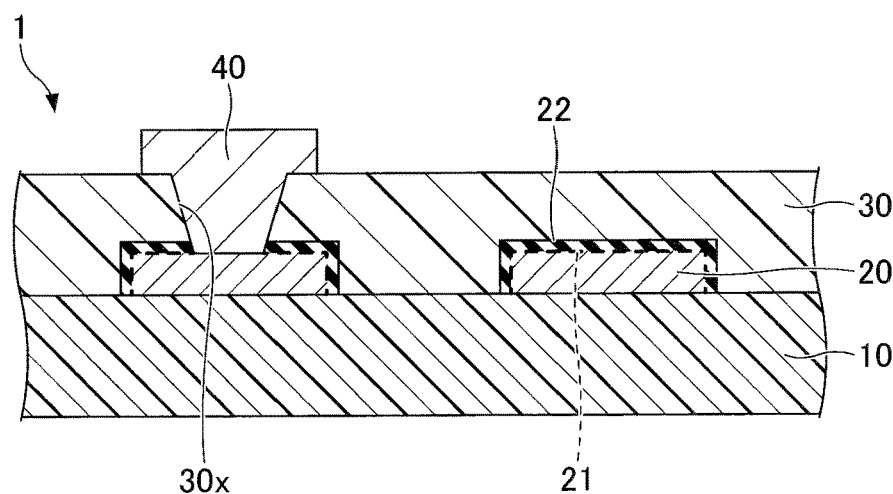

Next, in the process illustrated in FIG. 4C, the interconnect layer 40 is formed on the upper side of the insulating layer 30. The interconnect layer 40 includes the via interconnect filling the inside of the via hole 30x, and the interconnect pattern formed on the upper surface of the insulating layer 30. The interconnect pattern of the interconnect layer 40 is electrically connected to the interconnect layer 20 through the via interconnect. The wiring board 1 is completed by the processes described above.

Next, differences between the method of manufacturing the wiring board 1 according to the first embodiment, and the methods of manufacturing the wiring boards according to comparison examples, will be described.

Figure 5A:
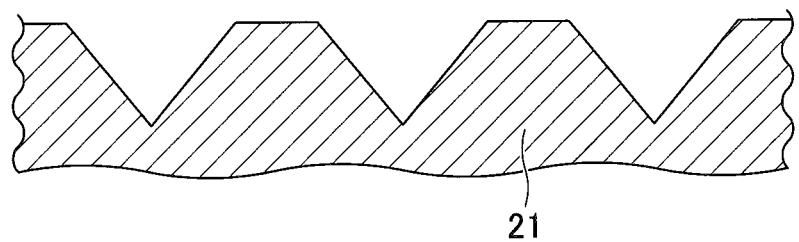
FIG. 5A, FIG. 5B, and FIG. 5C are diagrams illustrating examples of parts of manufacturing processes of a wiring board according to a first comparison example.
Figure 5B:
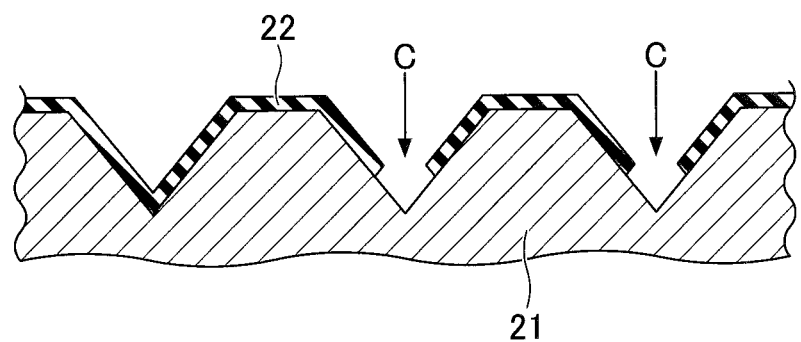
Figure 5C:
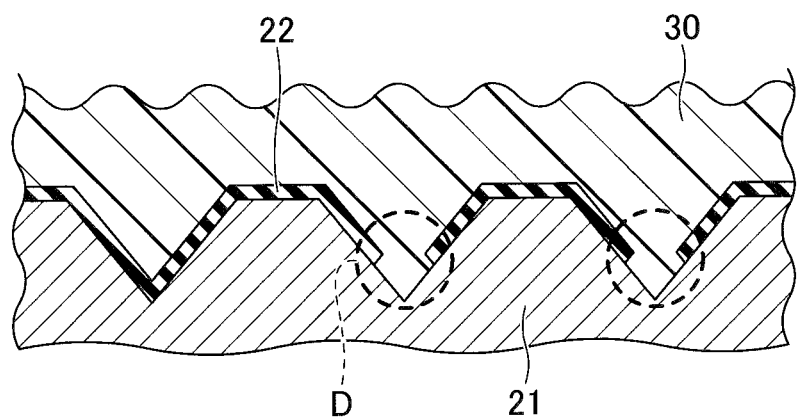

FIG. 5A through FIG. 5C are diagrams illustrating examples of parts of manufacturing processes of the wiring board according to a first comparison example. In the method of manufacturing the wiring board according to the first comparison example, after forming the concavo-convex portions 21 on the upper and side surfaces of the interconnect layer 20 as illustrated in FIG. 5A, the bond enhancing film 22 is formed as illustrated in FIG. 5B.

In order to make the thickness of the bond enhancing film 22 uniform, the processing time for obtaining the structure illustrated in FIG. 5B is set relatively short. For this reason, the thickness of the bond enhancing film 22 does not become partially thick, however, the chemical may not reach the bottom of the concave of the concavo-convex portions 21, and uncoated portions not formed with the bond enhancing film 22 may occur on the upper surface of the interconnect layer 20, as indicated by arrows C in FIG. 5B.

FIG. 5C illustrates a state where the insulating layer 30 is formed on the structure illustrated in FIG. 5B. At uncoated portions D of the interconnect layer 20 not formed with the bond enhancing film 22, indicated by dotted lines in FIG. 5C, the bonding strength between the interconnect layer 20 and the insulating layer 30 is weak and insufficient. Consequently, at a latter process accompanying thermal history, a separation, originating from the portions where bonding strength is weak and insufficient, may occur at the interface between the interconnect layer 20 and the insulating layer 30, thereby possibly deteriorating the insulation between adjacent portions of the interconnect layer 20 and deteriorating the reliability of the wiring board.

Figure 6A:
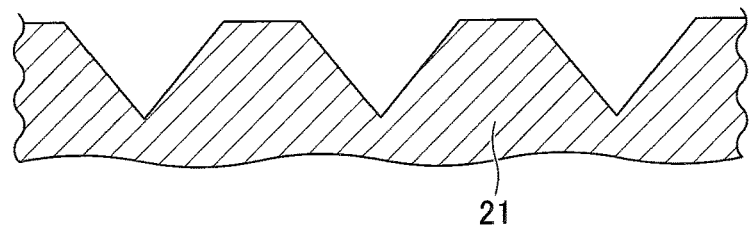
FIG. 6A, FIG. 6B, FIG. 6C, and FIG. 6D are diagrams illustrating examples of parts of manufacturing processes of the wiring board according to a second comparison example.
Figure 6B:
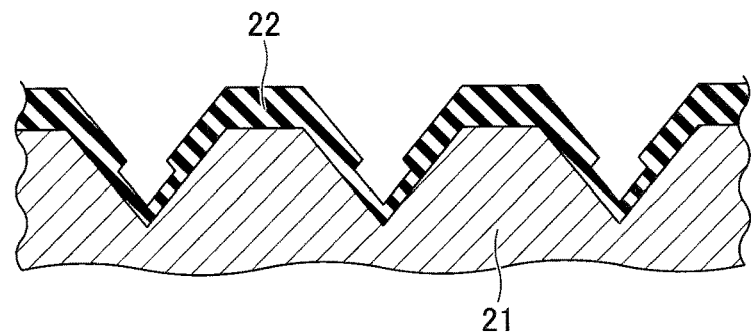

FIG. 6A through FIG. 6D, and FIG. 7A through FIG. 7C, are diagrams illustrating examples of parts of manufacturing processes of the wiring board according to a second comparison example. In the method of manufacturing the wiring board according to the second comparison example, after forming the concavo-convex portions 21 on the upper and side surfaces of the interconnect layer 20 as illustrated in FIG. 6A, the bond enhancing film 22 is formed as illustrated in FIG. 6B.

Unlike obtaining the structure illustrated in FIG. 5B, the processing time for obtaining the structure illustrated in FIG. 6B is set sufficiently long so that the chemical can reach the bottom of the concave of the concavo-convex portions 21, in order to prevent uncoated portions not formed with the bond enhancing film 22 from occurring at the bottom of the concave of the concavo-convex portions 21. As a result, a relatively thin bond enhancing film 22 is formed at the bottom of the concave of the concavo-convex portions 21, while a relatively thick bond enhancing film 22 is formed on the opposite side from the bottom of the concave of the concavo-convex portions 21, and no uncoated portions not formed with the bond enhancing film 22 occurs on the upper surface of the interconnect layer 20.

Figure 6C:
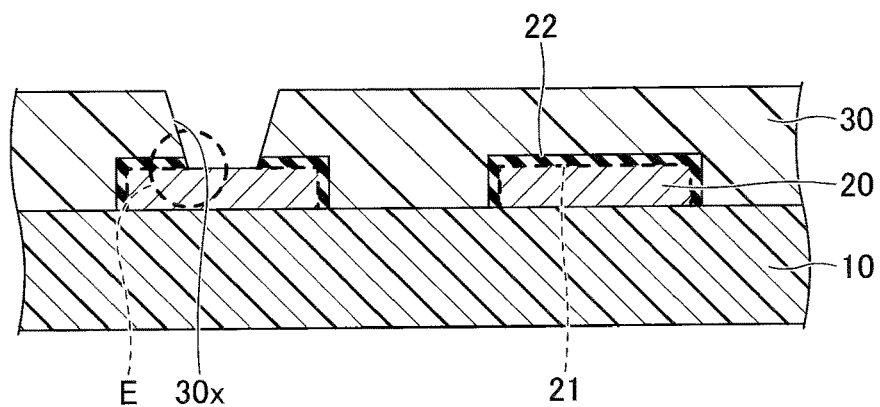
Figure 6D:
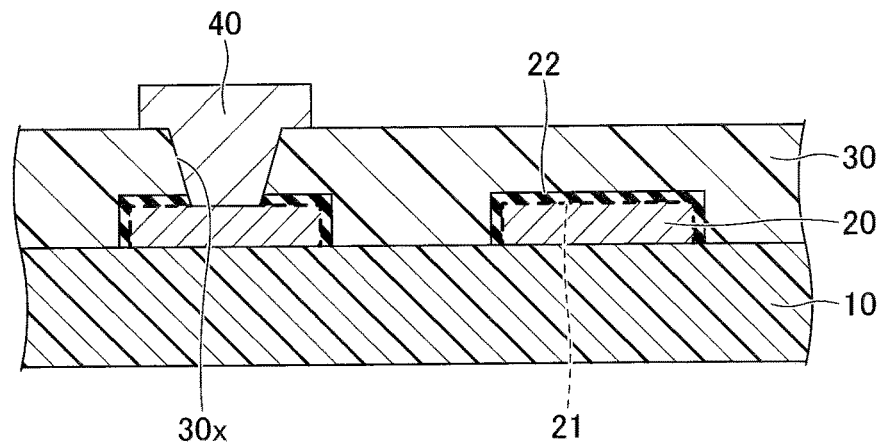

Next, as illustrated in FIG. 6C, the insulating layer 30 is formed on the insulating layer 10 to cover the interconnect layer 20, the via hole 30x exposing the upper surface of the interconnect layer 20 is formed in the insulating layer 30, and the processes such as the desmearing process and the soft etching are performed. Thereafter, the interconnect layer 40 is formed as illustrated in FIG. 6D.

Figure 7A:
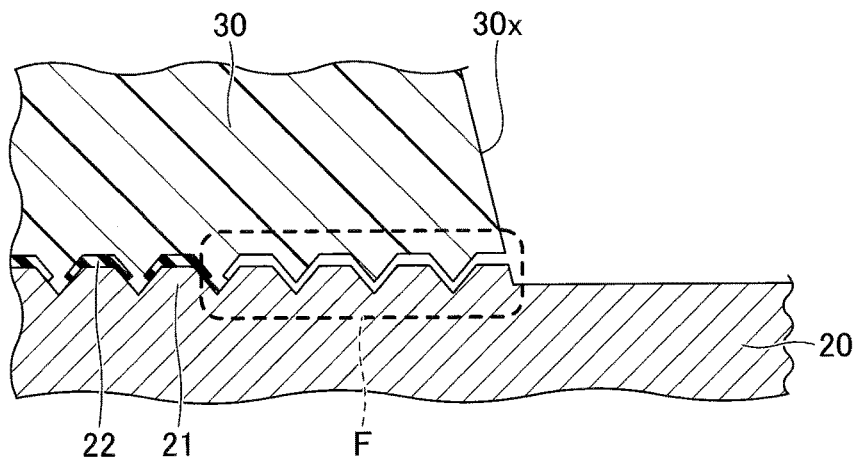
FIG. 7A, FIG. 7B, and FIG. 7C are diagrams illustrating examples of parts of the manufacturing processes of the wiring board according to the second comparison example.

FIG. 7A is an enlarged view of a portion E illustrated in FIG. 6C. The thick portion of the bond enhancing film 22 has a low chemical resistance. For this reason, when performing the desmearing process in FIG. 6C, the thick portion of the bond enhancing film 22, that is exposed to the chemical used for the desmearing process, is removed by the chemical, and a gap is formed in a portion F illustrated in FIG. 7A. Thereafter, when the soft etching is performed, a large cavity, originating from the gap where the thick portion of the bond enhancing film 22 is removed, is formed at a portion G indicated by dotted lines in FIG. 7B.

Figure 7B:
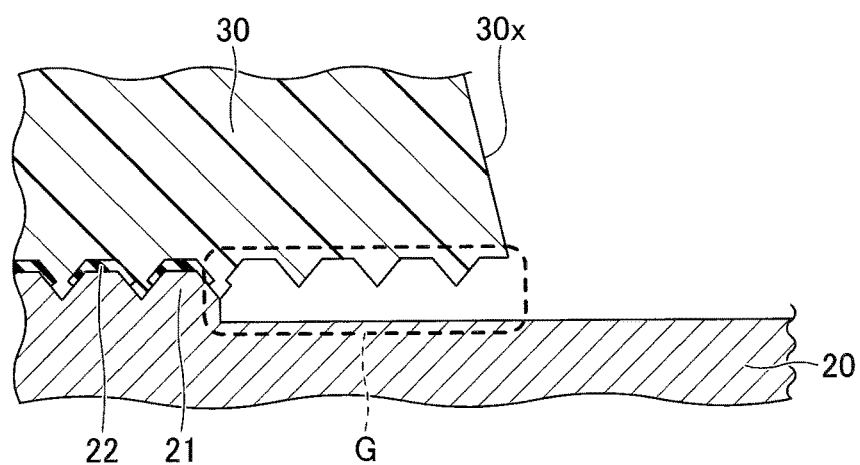
Figure 7C:
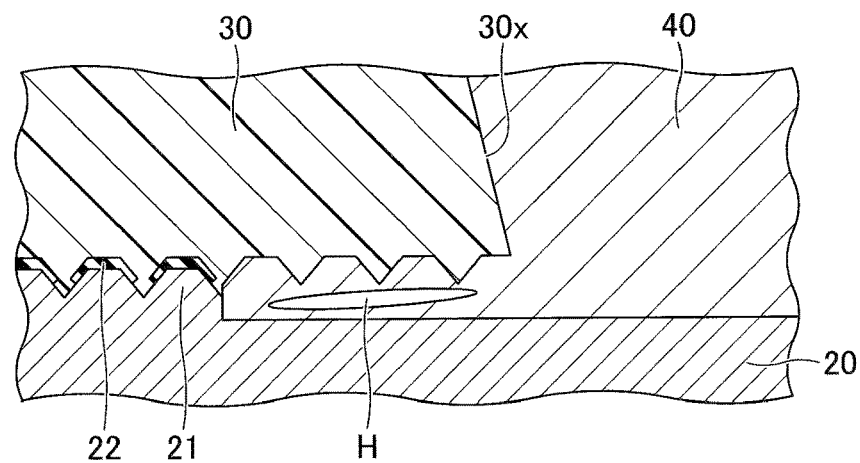

FIG. 7C schematically illustrates a state where the interconnect layer 40 is formed in the state illustrated in FIG. 7B. The metal (electroplating) forming the interconnect layer 40 cannot sufficiently fill the cavity formed at the portion G illustrated in FIG. 7B, thereby generating a void H illustrated in FIG. 7C. The reliability of the connection between the interconnect layer 20 and the interconnect layer 40 deteriorates when the void H is generated.

Hence, in the method of manufacturing the wiring board according the first comparison example, when the processing time in which the chemical can reach the bottom of the concave of the concavo-convex portions 21 is shorted in order to make the thickness of the bond enhancing film 22 uniform, the uncoated portions not formed with the bond enhancing film 22 occur at the bottom of the concave of the concavo-convex portions 21. In this case, the separation, originating from the uncoated portions not formed with the bond enhancing film 22, may occur at the interface between the interconnect layer 20 and the insulating layer 30, thereby possibly deteriorating the insulation between adjacent portions of the interconnect layer 20 and deteriorating the reliability of the wiring board.

Further, in the method of manufacturing the wiring board according the second comparison example, when the processing time in which the chemical can reach the bottom of the concave of the concavo-convex portions 21 is made sufficiently long, the uncoated portions not formed with the bond enhancing film 22 will not occur, however, the thick portion and the thin portion of the bond enhancing film 22 are generated. In addition, the bond enhancing film 22 may have a low chemical resistance (or etching resistance). As a result, when performing the soft etching, the large cavity is formed when the thick portion of the bond enhancing film 22 is removed, the metal forming the interconnect layer 40 cannot sufficiently fill this cavity when forming the interconnect layer 40, thereby generating the void H and deteriorating the reliability of the connection between the interconnect layer 20 and the interconnect layer 40.

On the other hand, in the method of manufacturing the wiring board 1 according to the first embodiment, the processing time in which the chemical can reach the bottom of the concave of the concavo-convex portions 21 is made sufficiently long. As a result, the relatively thin bond enhancing film 22 is formed at the bottom of the concave of the concavo-convex portions 21, and the relatively thick bond enhancing film 22 is formed on the opposite side from the bottom of the concave of the concavo-convex portions 21, however, no uncoated portions not formed with the bond enhancing film 22 occur. Further, the bond enhancing film 22 having the thickness inconsistency is dipped in the remover liquid 300, to improve the uniformity of the thickness of the bond enhancing film 22 totally on the concavo-convex portions 21. As a result, the above described problems encountered in the methods of manufacturing the wiring boards according to the comparison examples are not generated, and the bonding strength between the interconnect layer 20 and the insulating layer 30 can be improved. Moreover, high insulation can be provided by the insulating layer 30, and the reliability of the connection between the interconnect layer 20 and the interconnect layer 40 can be improved.

Second Embodiment

Figure 8A:
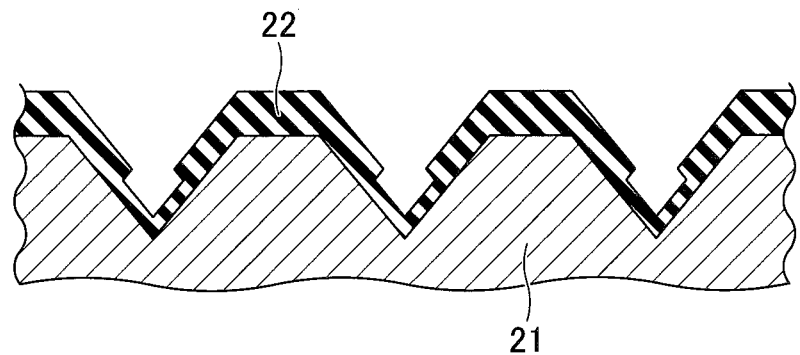
FIG. 8A, FIG. 8B, and FIG. 8C are diagrams illustrating examples of parts of the manufacturing processes of the wiring board according to a second embodiment.
Figure 8B:
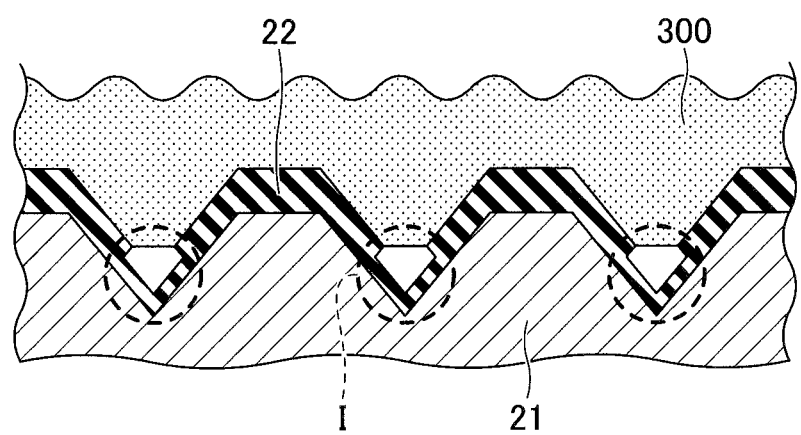
Figure 8C:
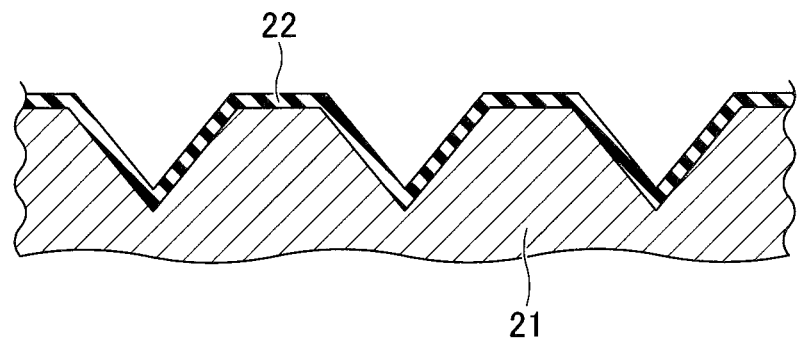

In a second embodiment, the uniformity of the thickness of the bond enhancing film 22 is increased by a method different from the method used in the first embodiment. The constituent elements of the second embodiment, that are the same the corresponding elements of the first embodiment described above, are designated by the same reference numerals, and a description thereof may be omitted. FIG. 8A, FIG. 8B, and FIG. 8C are diagrams illustrating examples of parts of the manufacturing processes of the wiring board according to the second embodiment.

FIG. 8A schematically illustrates, on an enlarged scale, the bond enhancing film 22 that is formed on the interconnect layer 20 provided with the concavo-convex portions 21 in the process illustrated in FIG. 2C.

Similar to the case illustrated in FIG. 3A, a relatively thin bond enhancing film 22 is formed at the bottom of the concave of the concavo-convex portions 21, and a relatively thick bond enhancing film 22 is formed on the opposite side from the bottom of the concave of the concavo-convex portions 21, and no uncoated portions not formed with the bond enhancing film 22 occur.

FIG. 8B and FIG. 8C schematically illustrate states where the uniformity of the thickness of the bond enhancing film 22 illustrated in FIG. 8A is increased.

FIG. 8B illustrates the state immediately after the bond enhancing film 22 is dipped into the remover liquid 300. An acid solution having a pH of 0 to 5 may be used for the remover liquid 300. The acid used for the remover liquid 300 is preferably a sulfuric acid. In this embodiment, the remover liquid 300 is adjusted to a viscosity that prevents the remover liquid 300 from reaching the bottom of the concave of the concavo-convex portions 21. More particularly, the viscosity of the remover liquid 300 is higher than the viscosity of the solution forming the bond enhancing film 22. A recommended viscosity of the remover liquid 300 is approximately 10 cP to approximately 15 cP. Accordingly, the remover liquid 300 does not reach the bottom of the concave of the concavo-convex portions 21, that is, a portion I indicated by dotted lines in FIG. 8B.

FIG. 8C schematically illustrates the state after the bond enhancing film 22 is dipped into the remover liquid 300 and a predetermined time elapses, and after the remover liquid 300 is removed. In the process illustrated in FIG. 8B, due to the high viscosity of the remover liquid 300, the remover liquid 300 does not reach the bottom of the concave of the concavo-convex portions 21. For this reason, after the predetermined time elapses, the bond enhancing film 22 formed on the portions other than the bottom of the concave of the concavo-convex portions 21 are partially removed, thereby increasing the uniformity of the thickness of the bond enhancing film 22. Preferably, the thickness of the bond enhancing film 22 becomes approximately uniform totally on the concavo-convex portions 21.

The processing time required for the thickness of the bond enhancing film 22 to become approximately uniform, totally on the concavo-convex portions 21, may be known from experimentation or simulation, by taking into consideration the inconsistency in the thickness of the bond enhancing film 22, the viscosity of the remover liquid 300, or the like.

Accordingly, it is possible to increase the uniformity of the thickness of the bond enhancing film 22, even when the remover liquid 300 used has the viscosity higher than the viscosity of the chemical forming the bond enhancing film 22. Processes similar to the processes illustrated in FIG. 4A through FIG. 4C may be performed after the process illustrated in FIG. 8C, to complete the wiring board 1, and improve the bonding strength between the interconnect layer 20 and the insulating layer 30, similar to the first embodiment. Further, high insulation can be provided by the insulating layer 30, and the reliability of the connection between the interconnect layer 20 and the interconnect layer 40 can be improved.

Accordingly to each of the embodiments described above, it is possible to improve the bonding strength between the interconnect layer and the insulating layer of the wiring board.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a wiring board, comprising:
   forming an interconnect layer on a first insulating layer;
   roughening a surface of the interconnect layer, not in contact with the first insulating layer, to form concavo-convex portions;
   forming a bond enhancing film on the concavo-convex portions using a silane coupling agent to form the bond enhancing film;
   partially removing the bond enhancing film, using an acid solution; and
   forming a second insulating layer on the first insulating layer, to cover the interconnect layer.

2. The method of manufacturing the wiring board as claimed in claim 1, wherein the forming the bond enhancing film forms the bond enhancing film along the concavo-convex portions, including a bottom of a concave of the concavo-convex portions.

3. The method of manufacturing the wiring board as claimed in claim 2, wherein
   the forming the bond enhancing film forms the bond enhancing film that includes a first portion formed on the bottom of the concave, and a second portion formed on an opposite side from the bottom, and
   the second portion has a thickness greater than a thickness of the first portion.

4. The method of manufacturing the wiring board as claimed in claim 3, wherein the partially removing the bond enhancing film reduces a difference between thicknesses of the first portion and the second portion, to increase uniformity of a thickness of the bond enhancing film.

5. The method of manufacturing the wiring board as claimed in claim 4, wherein the partially removing the bond enhancing film uses the acid solution that is adjusted to a viscosity that enables the acid solution to reach the bottom.

6. The method of manufacturing the wiring board as claimed in claim 3, wherein a viscosity of the acid solution is approximately the same as or lower than a viscosity of a solution forming the bond enhancing film.

7. The method of manufacturing the wiring board as claimed in claim 4, wherein the partially removing the bond enhancing film uses the acid solution that is adjusted to a viscosity that prevents the acid solution from reaching the bottom.

8. The method of manufacturing the wiring board as claimed in claim 3, wherein a viscosity of the acid solution is higher than a viscosity of a solution forming the bond enhancing film.

9. The method of manufacturing the wiring board as claimed in claim 1, wherein the roughening forms the concavo-convex portions having a roughness Ra in a range of 50 nm to 200 nm.

* * * * *

UNITED STATES PATENT AND TRADEMARK OFFICE
CERTIFICATE OF CORRECTION

| | | |
|---|---|---|
| PATENT NO. | : 11,001,930 B2 | Page 1 of 1 |
| APPLICATION NO. | : 16/905096 | |
| DATED | : May 11, 2021 | |
| INVENTOR(S) | : Tomoyuki Shimodaira and Hitoshi Kondo | |

It is certified that error appears in the above-identified patent and that said Letters Patent is hereby corrected as shown below:

On the Title Page

Please correct the item (73) Assignee:
To:
"SHINKO ELECTRIC INDUSTRIES CO., LTD., Nagano (JP)"
From:
"SHINKO ELECTRIC INDUSTRIES CO, LTD., Nagano (JP)"

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*